(12) United States Patent
Tanikawa et al.

(10) Patent No.: US 11,984,300 B2
(45) Date of Patent: May 14, 2024

(54) PLASMA PROCESSING APPARATUS

(71) Applicant: Tokyo Electron Limited, Tokyo (JP)

(72) Inventors: Takehiro Tanikawa, Miyagi (JP); Shuhei Yamabe, Miyagi (JP); Yohei Uchida, Miyagi (JP); Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 463 days.

(21) Appl. No.: 16/877,853

(22) Filed: May 19, 2020

(65) Prior Publication Data

US 2020/0373130 A1 Nov. 26, 2020

(30) Foreign Application Priority Data

May 21, 2019 (JP) ................. 2019-095099

(51) Int. Cl.
*H01L 21/00* (2006.01)
*H01J 37/32* (2006.01)

(52) U.S. Cl.
CPC .. *H01J 37/32623* (2013.01); *H01J 37/32082* (2013.01); *H01J 37/32532* (2013.01); *H01J 2237/334* (2013.01)

(58) Field of Classification Search
CPC .................................................. Y10S 156/916
USPC ......................................................... 156/916
See application file for complete search history.

(56) References Cited

U.S. PATENT DOCUMENTS

| 5,538,603 | A | * | 7/1996 | Guo | H01J 37/34 204/298.18 |
| 5,736,021 | A | * | 4/1998 | Ding | H01J 37/32504 204/192.12 |
| 6,562,189 | B1 | * | 5/2003 | Quiles | H01J 37/32871 156/345.43 |
| 7,137,353 | B2 | * | 11/2006 | Saigusa | H01J 37/32477 118/723 R |
| 9,455,125 | B2 | * | 9/2016 | Yoshimura | H01J 37/32568 |
| 2005/0115678 | A1 | * | 6/2005 | Vesci | H01J 37/3266 156/345.49 |
| 2007/0247778 | A1 | * | 10/2007 | Harb | H01L 21/68 361/234 |
| 2014/0187409 | A1 | * | 7/2014 | Kikuchi | H01J 37/32495 501/154 |

(Continued)

FOREIGN PATENT DOCUMENTS

| CN | 107212631 A | 9/2017 |
| JP | H11-087320 A | 3/1999 |

(Continued)

*Primary Examiner* — Sylvia Macarthur
*Assistant Examiner* — Michelle Crowell
(74) *Attorney, Agent, or Firm* — Pearne & Gordon LLP

(57) ABSTRACT

A plasma processing apparatus includes a chamber; a wall member; an insulating member; and a ground member. The wall member is partially placed in an internal space of the chamber and exposed to a space at an outside of the chamber. The insulating member is provided on the wall member. The ground member is made of silicon, provided in the internal space and mounted on the insulating member. The wall member is configured to support the ground member in a non-contact state with the insulating member therebetween. The ground member is in contact with a spherical surface of the insulating member and mounted on the spherical surface.

4 Claims, 8 Drawing Sheets

(56) References Cited

U.S. PATENT DOCUMENTS

| | | | | |
|---|---|---|---|---|
| 2015/0059981 A1* | 3/2015 | Huston | ................... | C23C 16/46 |
| | | | | 118/733 |
| 2015/0179485 A1 | 6/2015 | Hiroki | | |
| 2015/0187542 A1* | 7/2015 | Ishida | ............... | H01J 37/32513 |
| | | | | 156/345.1 |
| 2015/0226540 A1* | 8/2015 | Rajagopalan | ........... | H01L 21/00 |
| | | | | 356/402 |
| 2017/0069466 A1* | 3/2017 | Tran | ................. | H01J 37/32449 |
| 2018/0233327 A1* | 8/2018 | Kalnin | ............. | C23C 16/45591 |
| 2019/0348262 A1* | 11/2019 | Hayasaka | ......... | H01J 37/32743 |
| 2020/0402775 A1* | 12/2020 | Hayasaka | ......... | H01J 37/32449 |
| 2021/0272779 A1* | 9/2021 | Hayasaka | ......... | H01J 37/32522 |
| 2021/0343508 A1* | 11/2021 | Nguyen | ............ | H01J 37/32495 |

FOREIGN PATENT DOCUMENTS

| | | | | | |
|---|---|---|---|---|---|
| JP | 2012-138497 A | | 7/2012 | | |
| JP | 2013-093449 A | | 5/2013 | | |
| JP | 2015-144242 A | | 8/2015 | | |
| JP | 2020043328 A | * | 3/2020 | ............. | C23C 16/44 |
| KR | 20190100376 A | * | 8/2019 | ............. | C23C 16/44 |
| TW | 202105502 A | * | 2/2021 | ........ | H01J 37/32082 |

* cited by examiner

PLASMA PROCESSING APPARATUS

CROSS-REFERENCE TO RELATED APPLICATION

This application claims the benefit of Japanese Patent Application No. 2019-095099 filed on May 21, 2019, the entire disclosure of which is incorporated herein by reference.

TECHNICAL FIELD

The various aspects and embodiments described herein pertain generally to a plasma processing apparatus.

BACKGROUND

A plasma processing apparatus is used to process a substrate. The plasma processing apparatus is equipped with a chamber. The plasma processing apparatus is configured to form plasma by dissociating a gas within the chamber. A ground member may be provided within the chamber. The plasma processing apparatus equipped with the ground member is described in Patent Document 1.

Patent Document 1: Japanese Patent Laid-open Publication No. 2012-138497

SUMMARY

In one exemplary embodiment, a plasma processing apparatus configured to perform a plasma processing is provided. The plasma processing apparatus includes: a chamber; a wall member; one or more insulating members; and a ground member. The wall member is partially placed in an internal space of the chamber, and extends from the internal space toward an outside of the chamber to be exposed to a space at the outside of the chamber. The one or more insulating members are provided on the wall member. The ground member is made of silicon, provided in the internal space and mounted on the one or more insulating members. The ground member as well as the wall member is set to have a ground potential. The wall member is configured to support the ground member in a non-contact state with the one or more insulating members therebetween. Each of the one or more insulating members has a spherical surface. The ground member is in contact with the spherical surface and mounted on the spherical surface.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
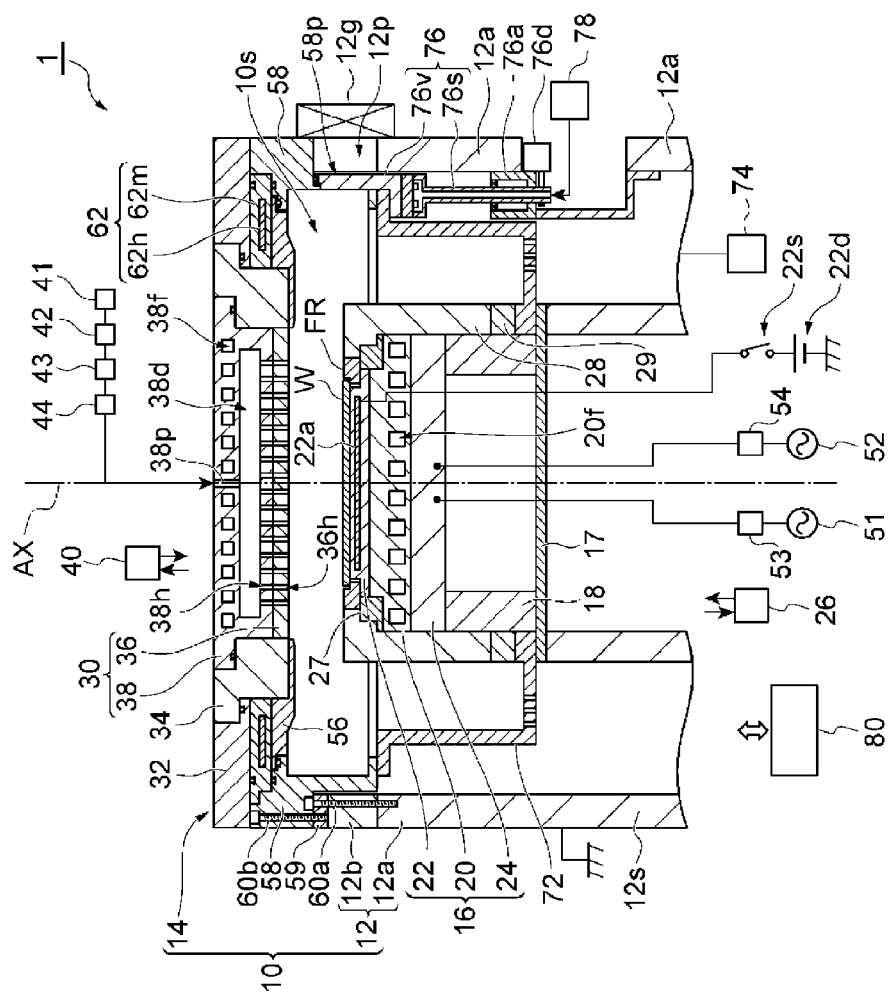
FIG. 1 is a diagram schematically illustrating a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

According to an exemplary embodiment, there is provided a plasma processing apparatus configured to perform a plasma processing. The plasma processing apparatus includes a chamber, a wall member, one or more insulating members and a ground member. The wall member is partially disposed in an internal space of the chamber, and extends from the internal space toward an outside of the chamber to be exposed to a space at the outside of the chamber. The one or more insulating members are provided on the wall member. The ground member is made of silicon. The ground member is provided in the internal space. The ground member as well as the wall member is set to have a ground potential. The ground member is mounted on the one or more insulating members. The ground member is configured to support the ground member in a non-contact state with the one or more insulating members therebetween. Each of the one or more insulating members has a spherical surface. The ground member is in contact with the spherical surface and mounted on this spherical surface.

In the plasma processing apparatus according to the exemplary embodiment, since the wall member is exposed to the space at the outside of the chamber, the wall member can be cooled. Accordingly, chemical species from plasma is deposited on a surface of the wall member, so that etching of the wall member can be suppressed. Further, since the ground member is not in contact with the wall member, heat exchange between the wall member and the ground member is suppressed, so that cooling of the ground member is suppressed. Accordingly, formation of a micro mask on a surface of the ground member by the chemical species from the plasma can be suppressed, and etching of the ground member in the state that the micro mask is formed is suppressed. Furthermore, the ground member is mounted on the spherical surface(s) of the one or more insulating members. Accordingly, heat exchange between each of the one or more insulating members and the ground member is suppressed, and the heat exchange between the wall member and the ground member is further suppressed. In addition, local application of a large force to the ground member is also suppressed. Therefore, the damage of the ground member is suppressed.

In the exemplary embodiment, the one or more heating members may be multiple spherical bodies.

In the exemplary embodiment, the wall member may be provided with multiple grooves opened upwards. In the present exemplary embodiment, each of the multiple spherical bodies may be partially inserted in a corresponding groove among the multiple grooves.

In the exemplary embodiment, each of the multiple grooves may be a form of a gourd. In the present exemplary embodiment, a width of an open end thereof is smaller than a diameter of each of the multiple spherical bodies. In the present exemplary embodiment, a center of each of the multiple spherical bodies is located within the corresponding groove among the multiple grooves. According to the present exemplary embodiment, the spherical bodies are suppressed from being escaped from the wall member.

In the exemplary embodiment, a bottom surface forming a bottom of each of the multiple grooves may be partially provided with a recess. In the present exemplary embodiment, each of the multiple spherical bodies may be partially put within the recess in the corresponding groove. According to the present exemplary embodiment, the movement of each spherical body within the corresponding groove is suppressed. Further, non-uniformity in positions of the spherical bodies in a height direction, which might be caused by the presence of depressions of the wall member due to the contact between the spherical bodies and the wall member, and non-uniformity in a contact pressure between the spherical bodies and the ground member can be suppressed.

In the exemplary embodiment, a region of the bottom surface of the wall member forming the recess may have a spherical concave surface. In the present exemplary embodiment, each of the spherical bodies is placed to partially extend along this region.

In the exemplary embodiment, the one or more insulating members may have thermal conductivity lower than thermal conductivity of the ground member and thermal conductivity of the wall member.

In the exemplary embodiment, the one or more heat insulating members may be made of ceramics, quartz or stainless steel.

Hereinafter, various exemplary embodiments will be described in detail with reference to the accompanying drawings. In the various drawings, same or corresponding parts will be assigned same reference numerals.

Figure 2:
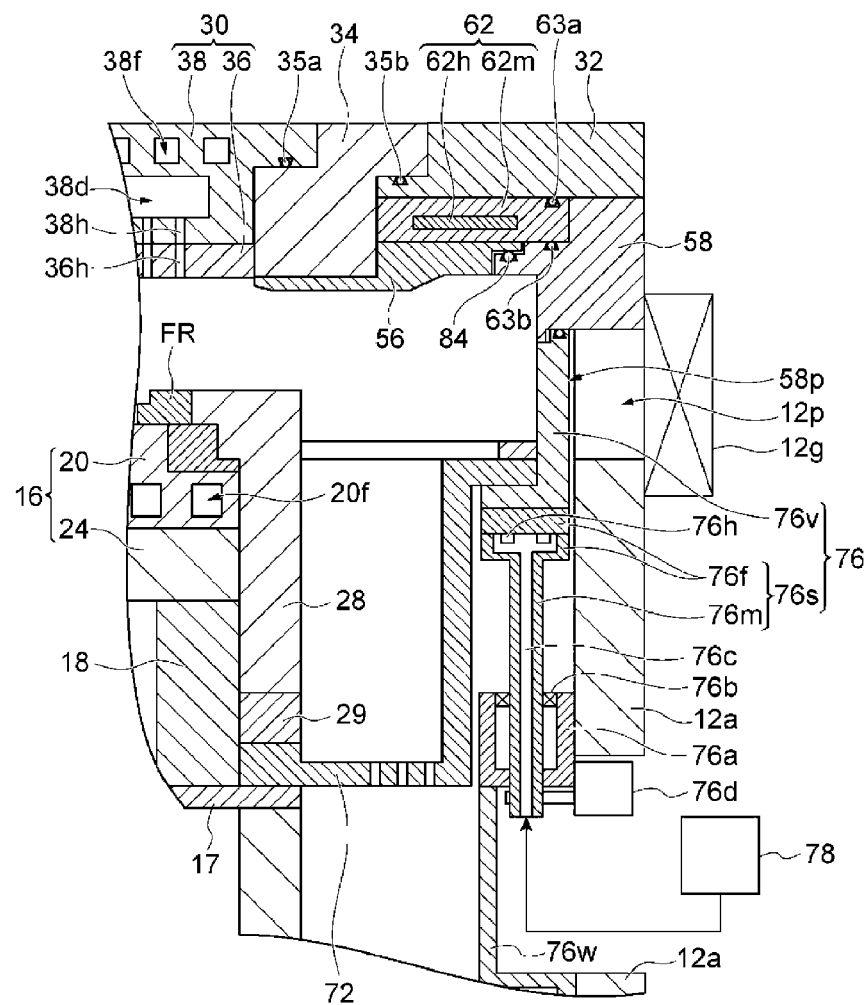
FIG. 2 is a partially enlarged cross sectional view of the plasma processing apparatus shown in FIG. 1.
Figure 3:
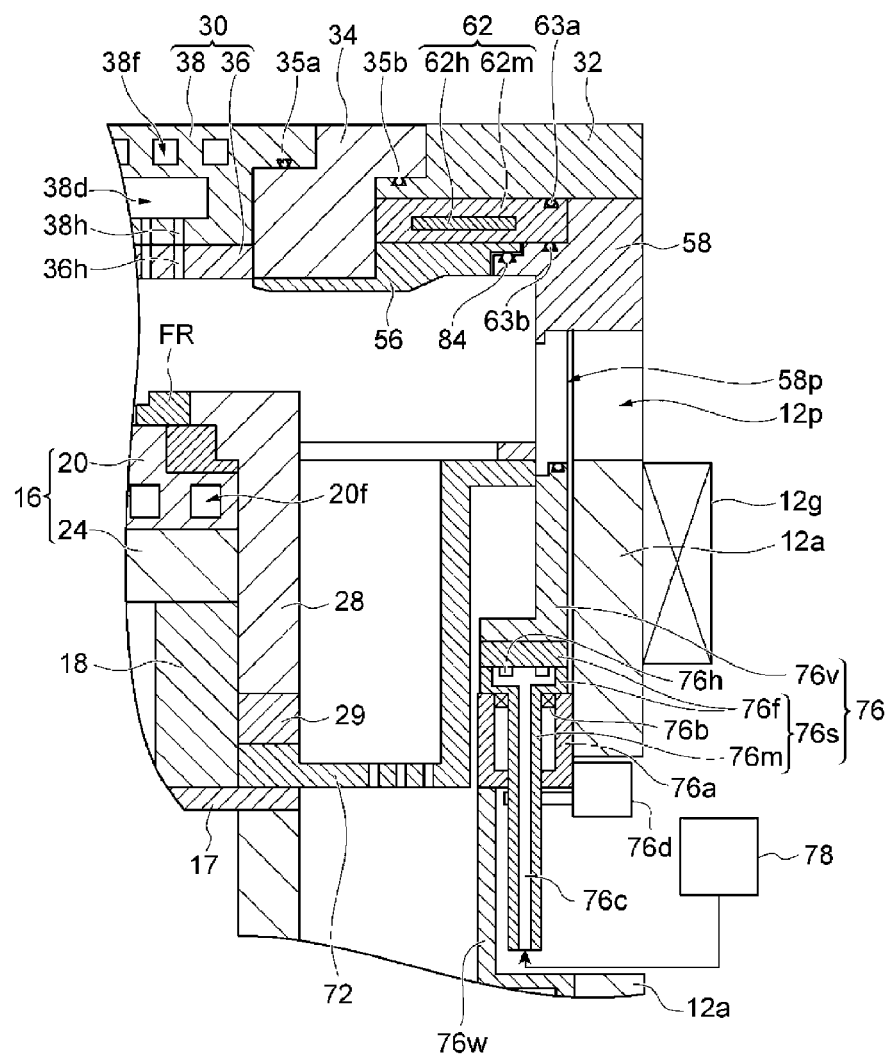
FIG. 3 is a partially enlarged cross sectional view of the plasma processing apparatus shown in FIG. 1.
Figure 4:
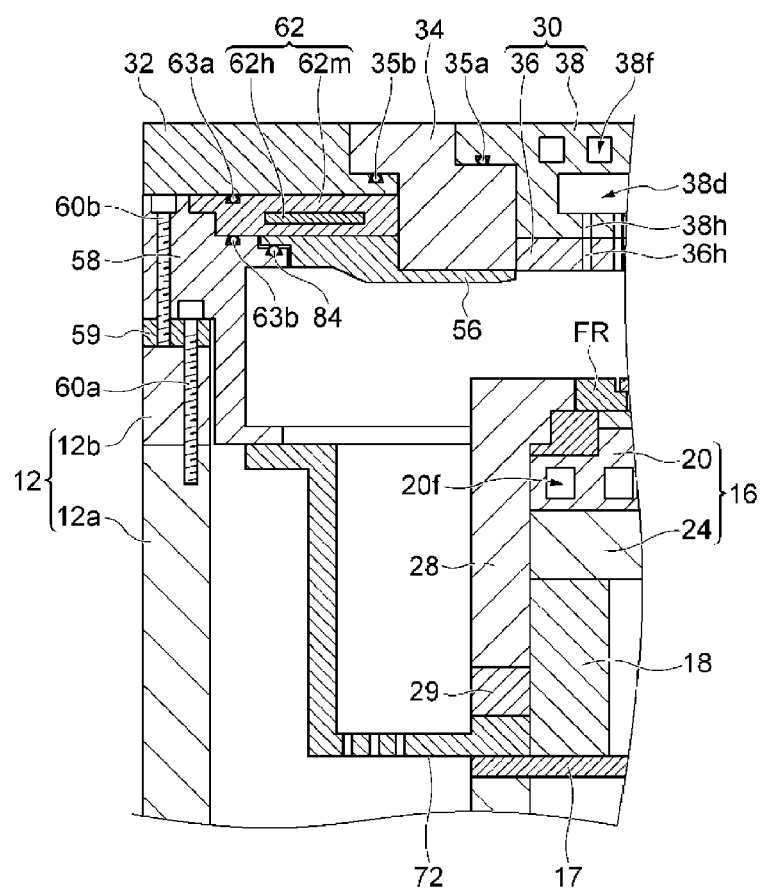
FIG. 4 is a partially enlarged cross sectional view of the plasma processing apparatus shown in FIG. 1.

FIG. 1 is a diagram schematically illustrating a plasma processing apparatus according to an exemplary embodiment. FIG. 2, FIG. 3 and FIG. 4 are partially enlarged cross sectional views of the plasma processing apparatus shown in FIG. 1. FIG. 2 illustrates a state where a valve body of an example shutter device closes a corresponding opening. Further, FIG. 3 illustrates a state where the valve body of the example shutter device opens the corresponding opening. A plasma processing apparatus 1 shown in FIG. 1 to FIG. 4 is equipped with a chamber 10. The chamber 10 has an internal space 10s therein. The internal space 10s can be decompressed. Plasma is formed in this internal space 10s.

In the exemplary embodiment, the chamber 10 may include a chamber main body 12 and a ceiling member 14. The chamber main body 12 forms a sidewall and a bottom of the chamber 10. The chamber main body 12 has a substantially cylindrical shape. A central axis of the chamber main body 12 substantially coincides with an axis AX which extends in a vertical direction. The chamber main body 12 is electrically grounded. The chamber main body 12 is made of, by way of non-limiting example, aluminum. A corrosion-resistant film is formed on a surface of the chamber main body 12. The corrosion-resistant film is made of a material such as, but not limited to, aluminum oxide or yttrium oxide.

An opening 12p is formed at the sidewall of the chamber 10. The opening 12p is provided by the chamber main body 12. The opening 12p can be opened or closed by a gate valve 12g. A substrate W passes through the opening 12p when it is transferred between the internal space 10s and an outside of the chamber 10.

In the exemplary embodiment, the chamber main body 12 includes a first member 12a and a second member 12b. The first member 12a has a substantially cylindrical shape. The first member 12a forms the bottom and a part of the sidewall of the chamber 10. The second member 12b has a substantially cylindrical shape. The second member 12b is provided on top of the first member 12a. The second member 12b forms the rest part of the sidewall of the chamber 10. The second member 12b is provided with the opening 12p.

A supporting table 16 is provided in the internal space 10s. The supporting table 16 is configured to support the substrate W placed thereon. A bottom plate 17 is provided under the supporting table 16. The bottom plate 17 is supported by the bottom of the chamber 10, for example, the first member 12a. A supporting body 18 extends upwards from the bottom plate 17. The supporting body 18 has a substantially cylindrical shape. The supporting body 18 is formed of an insulator such as, but not limited to, quartz. The supporting table 16 is mounted on and supported by the supporting body 18.

The supporting table 16 includes a lower electrode 20 and an electrostatic chuck 22. The supporting table 16 may further include an electrode plate 24. The electrode plate 24 has a substantially disk shape. A central axis of the electrode plate 24 substantially coincides with the axis AX. The electrode plate 24 is made of a conductor such as, but not limited to, aluminum.

The lower electrode 20 is provided on the electrode plate 24. The lower electrode 20 is electrically connected with the electrode plate 24. The lower electrode 20 has a substantially disk shape. A central axis of the lower electrode 20 substantially coincides with the axis AX. The lower electrode 20 is made of a conductor such as, but not limited to, aluminum. A path 20f is formed within the lower electrode 20. The path 20f extends in, for example, a spiral shape. A coolant is supplied into the path 20f from a chiller unit 26. The chiller unit 26 is provided at the outside of the chamber 10. The chiller unit 26 supplies, for example, the coolant in a liquid phase into the path 20f. The coolant supplied into the path 20f is returned back into the chiller unit 26.

The electrostatic chuck 22 is provided on the lower electrode 20. The electrostatic chuck 22 includes a main body and an electrode 22a. The main body of the electrostatic chuck 22 has a substantially disk shape. A central axis of the electrostatic chuck 22 substantially coincides with the axis AX. The main body of the electrostatic chuck 22 is formed of ceramic. The electrode 22a is a film made of a conductor. The electrode 22a is provided within the main body of the electrostatic chuck 22. The electrode 22a is connected with a DC power supply 22d via a switch 22s. To hold the substrate W on the electrostatic chuck 22, a voltage is applied to the electrode 22a from the DC power supply 22d. If the voltage is applied to the electrode 22a, an electrostatic attraction force is generated between the electrostatic chuck 22 and the substrate W. The substrate W is attracted to and held by the electrostatic chuck 22 by the generated electrostatic attraction force. The plasma processing apparatus 1 may be provided with a gas line through which a heat transfer gas (for example, a helium gas) is supplied into a gap between the electrostatic chuck 22 and a rear surface of the substrate W.

A focus ring FR is placed on a peripheral portion of the electrostatic chuck 22 to surround the substrate W. The focus ring FR is used to improve in-surface uniformity of a plasma processing upon the substrate W. The focus ring FR is formed of, by way of non-limiting example, silicon, quartz or silicon carbide. A ring 27 is provided between the focus ring FR and the lower electrode 20. The ring 27 is made of an insulator.

In the exemplary embodiment, the plasma processing apparatus 1 may be further equipped with a cylindrical member 28 and a cylindrical member 29. The cylindrical member 28 extends along outer side surfaces of the supporting table 16 and the supporting body 18. The cylindrical member 28 is provided on top of the cylindrical member 29. The cylindrical member 28 is made of an insulator having corrosion resistance. By way of non-limiting example, the cylindrical member 28 is made of, for example, quartz. The cylindrical member 29 extends along the outer side surface of the supporting body 18. The cylindrical member 29 is made of an insulator having corrosion resistance. By way of non-limiting example, the cylindrical member 29 is made of, for example, quartz.

The ceiling member 14 is configured to close a top opening of the chamber 10. The ceiling member 14 includes an upper electrode 30. The ceiling member 14 may further include a member 32 and a member 34. The member 32 is a substantially ring-shaped plate and made of a metal such as, but not limited to, aluminum. The member 32 is provided on the sidewall of the chamber 10 with a wall member 58 to be described later therebetween. The member 34 is provided between the upper electrode 30 and the member 32. The member 34 extends in a circumferential direction around the axis AX. The member 34 is made of an insulator such as, but not limited to, quartz. Further, a sealing member 35a such as an O-ring is provided between the upper electrode 30 and the member 34, and a sealing member 35b such as an O-ring is provided between the member 34 and the member 32.

The upper electrode 30 includes a ceiling plate 36 and a supporting body 38. The ceiling plate 36 has a substantially disk shape. The ceiling plate 36 is in contact with the internal space 10s. The ceiling plate 36 is provided with a multiple number of gas discharge holes 36h. These gas discharge holes 36h are formed through the ceiling plate 36 in a plate thickness direction thereof (vertical direction). This ceiling plate 36 is made of, by way of example, but not limitation, silicon, aluminum oxide or quartz. Alternatively, the ceiling plate 36 may have a structure in which a corrosion-resistant film is formed on a surface of a member which is made of a conductor such as aluminum. This corrosion-resistant film may be made of a material such as, but not limited to, aluminum oxide or yttrium oxide.

The supporting body 38 is provided on the ceiling plate 36. The supporting body 38 supports the ceiling plate 36 in a detachable manner. The supporting body 38 is made of, by way of non-limiting example, aluminum. The supporting body 38 is provided with a path 38f. The path 38f extends in, for example, a spiral shape within the supporting body 38. A coolant is supplied into the path 38f from a chiller unit 40. The chiller unit 40 is provided at the outside of the chamber 10. The chiller unit 40 supplies the coolant in a liquid phase (for example, cooling water) into the path 38f. The coolant supplied into the path 38f is returned back into the chiller unit 40. This chiller unit 40 is capable of supplying the coolant into the path 38f at a flow rate equal to or larger than, e.g., 4 L/min.

A gas diffusion space 38d is formed within the supporting body 38. The supporting body 38 is also provided with a multiple number of holes 38. These holes 38h extend downwards from the gas diffusion space 38d and respectively connected to the gas discharge holes 36h. The supporting body 38 is further provided with a port 38p. The port 38p is connected to the gas diffusion space 38d. A gas source group 41 is connected to this port 38p via a valve group 42, a flow rate controller group 43 and a valve group 44.

The gas source group 41 includes a plurality of gas sources. The valve group 42 and the valve group 44 include a plurality of valves, respectively. The flow rate controller group 43 includes a plurality of flow rate controllers. Each of the flow rate controllers may be a mass flow controller or a pressure control type flow rate controller. Each of the gas sources belonging to the gas source group 41 is connected to the port 38p via a corresponding valve belonging to the valve group 42, a corresponding flow rate controller belonging to the flow rate controller group 43, and a corresponding valve belonging to the valve group 44. In the plasma processing apparatus 1, gases from one or more gas sources selected from the plurality of gas sources belonging to the gas source group 41 are supplied into the gas diffusion space 38d. The gases supplied into the gas diffusion space 38d is then introduced into the internal space 10s through the gas discharge holes 36h.

The plasma processing apparatus 1 is further equipped with a first high frequency power supply 51 and a second high frequency power supply 52. The first high frequency power supply 51 is configured to generate a first high frequency power for plasma formation. A frequency of the first high frequency power is equal to or higher than, e.g., 27 MHz. The first high frequency power supply 51 is electrically connected to the lower electrode 20 via a matching device 53. The matching device 53 is equipped with a matching circuit configured to match an impedance at a load side (lower electrode 20 side) with an output impedance of the first high frequency power supply 51. Further, the first high frequency power supply 51 may not be connected to the lower electrode 20 but be connected to the upper electrode 30 via the matching device 53.

The second high frequency power supply 52 is configured to generate a second high frequency power for ion attraction into the substrate W. A frequency of the second high frequency power is equal to or lower than, e.g., 13.56 MHz. The second high frequency power supply 52 is electrically connected to the lower electrode 20 via a matching device 54. The matching device 54 is equipped with a matching circuit configured to match the impedance at the load side (lower electrode 20 side) with an output impedance of the second high frequency power supply 52.

The plasma processing apparatus 1 further includes the wall member 58. The wall member 58 is partially disposed in the internal space 10s. That is, a part of the wall member 58 is exposed to the plasma in the internal space 10s. The wall member 58 extends from the internal space 10s toward the outside of the chamber 10 and is exposed to a space at the outside of the chamber 10.

In the exemplary embodiment, the wall member 58 extends along an inner wall surface of the chamber 10 to suppress a by-product from the plasma processing from being deposited on the inner wall surface of the chamber 10. To elaborate, the wall member 58 extends along an inner wall surface of the chamber main body 12 or an inner wall surface of the second member 12b. The wall member 58 has a substantially cylindrical shape. The wall member 58 may be fabricated by forming a corrosion-resistance film on a surface of a member made of a conductor such as aluminum. The corrosion-resistance film is made of a material such as, but not limited to, aluminum oxide or yttrium oxide. Further, the wall member 58 is connected to the ground and set to have a ground potential.

In the exemplary embodiment, the wall member 58 is held between the chamber main body 12 and the ceiling member 14. By way of example, the wall member 58 is held between the second member 12b of the chamber main body 12 and the member 32 of the ceiling member 14.

In the exemplary embodiment, the plasma processing apparatus 1 further includes a spacer 59. The spacer 59 is of a plate shape and extends in the circumferential direction around the axis AX. The spacer 59 is provided between the wall member 58 and the chamber 10. The spacer 59 is made of, by way of example, a conductor. The spacer 59 may be made of a material having thermal conductivity lower than thermal conductivity of aluminum. By way of non-limiting example, the spacer 59 may be made of stainless steel. However, the material of the spacer 59 is not limited to the stainless steel as long as the material has thermal conductivity lower than the thermal conductivity of the aluminum. By way of another example, the spacer 59 may be made of aluminum.

In the exemplary embodiment, the spacer 59 is provided between the wall member 58 and the second member 12b. In the exemplary embodiment, the spacer 59 and the second member 12b are fixed to the first member 12a by using a screw 60a. The screw 60a is screwed into a screw hole of the first member 12a after penetrating the spacer 59 and the second member 12b. The wall member 58 is fixed to the spacer 59 by using a screw 60b. The screw 60b is screwed into a screw hole of the spacer 59 after penetrating the wall member 58. According to the present exemplary embodiment, even if the wall member 58 is separated from the chamber 10 for the purpose of, for example, maintenance thereof, the spacer 59 and the second member 12b are kept fixed to the first member 12a by the screw 60a. Accordingly, while maintaining the spacer 59 and the second member 12b fixed to the first member 12a, the wall member 58 can be separated from the chamber 10.

In the exemplary embodiment, the plasma processing apparatus 1 is further equipped with a heater unit 62. The heater unit 62 includes a main body 62m and a heater 62h. The heater 62h is configured to heat the wall member 58. The heater 62h may be a resistance heating element. The heater 62h is provided within the main body 62m. The main body 62m is thermally in contact with the wall member 58. In the exemplary embodiment, the main body 62m is physically in contact with the wall member 58. The main body 62m is formed of a conductor such as aluminum. The heater 62h is configured to heat the wall member 58 via the main body 62m. In the exemplary embodiment, the main body 62m is of a substantially annular plate shape and extends in the circumferential direction to surround the upper electrode 30.

The plasma processing apparatus 1 is further equipped with a ground member 56. The ground member 56 may form a part of the ceiling member 14. The ground member 56 is made of silicon (for example, polycrystalline silicon). The ground member 56 is provided in the internal space 10s, that is, in the space in which the plasma is formed. The ground member 56 is connected to the ground. The ground member 56 as well as the wall member 58 is set to have a ground potential.

In the exemplary embodiment, the ground member 56 has a substantially annular plate shape. The ground member 56 extends in the circumferential direction at a region outside the ceiling plate 36 in the diametrical direction thereof. The diametrical direction is a radial direction with respect to the axis AX. The heater unit 62 is located between the ground member 56 and the member 32 and, also, between the member 34 and the wall member 58.

A sealing member such as an O-ring is provided between the main body 62m and nearby members to separate a decompressed environment including the internal space 10s from an atmospheric environment. To elaborate, a sealing member 63a is provided between the main body 62m and the member 32, and a sealing member 63b is provided between the main body 62m and the wall member 58.

In the exemplary embodiment, a baffle member 72 is provided between the wall member 58 and the supporting body 18. In the exemplary embodiment, the baffle member 72 has a substantially cylindrical shape. An upper end of the baffle member 72 is formed to have a brim shape. A lower end of the baffle member 72 is formed to have a substantially ring shape and extends inwards in the diametrical direction. An outer peripheral portion of the upper end of the baffle member 72 is coupled to a lower end of the wall member 58. An inner peripheral portion of the lower end of the baffle member 72 is held between the cylindrical member 29 and the bottom plate 17. The baffle member 72 is formed of a plate made of a conductor such as aluminum. A corrosion-resistance film is formed on a surface of the baffle member 72. The corrosion-resistance film is made of a material such as, but not limited to, aluminum oxide or yttrium oxide. The baffle member 72 is provided with a plurality of through holes.

The internal space 10s includes a gas exhaust region extending under the baffle member 72. A gas exhaust device 74 is connected to this gas exhaust region. The gas exhaust device 74 includes a pressure controller such as an automatic pressure control valve and a decompression pump such as a turbo molecular pump.

The wall member 58 is provided with an opening 58p. The opening 58p is formed at the wall member 58 to face the opening 12p. The substrate W passes through the opening 12p and the opening 58p when it is transferred between the internal space 10s and the outside of the chamber 10.

In the exemplary embodiment, the plasma processing apparatus 1 is further equipped with a shutter device 76. The shutter device 76 is configured to open or close the opening 58p. The shutter device 76 has a valve body 76v and a shaft body 76s. The shutter device 76 may further include a cylindrical body 76a, a sealing member 76b, a wall member 76w and a driving unit 76d.

The valve body 76v closes the opening 58p in the state that it is placed within the opening 58p. The valve body 76v is supported by the shaft body 76s. That is, the shaft body 76s is connected to the valve body 76v. The shaft body 76s extends downwards from the valve body 76v. The shaft body 76s includes a main part 76m and a flange 76f. The main part 76m has a substantially cylindrical shape. That is, the shaft body 76s has a cavity 76c therein. The flange 76f is provided on an upper end of the main body 76m. The valve body 76v is provided on the flange 76f. The cavity 76c of the shaft body 76s is also formed within the flange 76f. A heater 76h is provided within the flange 76f. The heater 76h is, for example, a resistance heating element. The heater 76h is configured to heat the valve body 76v via the flange 76f.

The cylindrical body 76a has a cylindrical shape. The cylindrical body 76a is directly or indirectly fixed to the chamber main body 12. The main part 76m of the shaft body 76s is configured to be movable up and down through the inside of the cylindrical body 76a. The driving unit 76d is configured to generate a power for moving the main part 76m of the shaft body 76s up and down. The driving unit 76d includes, for example, a motor.

The sealing member 76b is provided within the cylindrical body 76a. The sealing member 76b closes a gap between the cylindrical body 76a and the main part 76m of the shaft body 76s, thus allowing the internal space 10s to be hermetically sealed. The sealing member 76b may be, but not limited to, an O-ring or a magnetic fluid seal. The wall member 76w extends between the cylindrical body 76a and the chamber main body 12. The wall member 76w closes a gap between the cylindrical body 76a and the chamber main body 12, thus allowing the internal space 10s to be hermetically sealed.

In the exemplary embodiment, the plasma processing apparatus 1 may be further equipped with a supply device 78. The supply device 78 is configured to supply a coolant into the cavity 76c. The coolant may be, by way of non-limiting example, air, cooled air or an inert gas. If the coolant is supplied into the shaft body 76s of the shutter device 76, the valve body 76v is cooled indirectly. Thus, it is possible to cool the valve body 76v indirectly without needing to supply the coolant to the valve body 76v directly.

In the exemplary embodiment, the plasma processing apparatus 1 may be further equipped with a controller 80. The controller 80 is configured to control the individual components of the plasma processing apparatus 1. The controller 80 may be implemented by, for example, a computer device. The controller 80 includes a processor, a storage, an input device such as a keyboard, a display device and an input/output interface for signals. The storage stores therein a control program and recipe data. The processor executes the control program, and sends control signals to the individual components of the plasma processing apparatus 1 via the input/output interface according to the recipe data.

As stated above, in the plasma processing apparatus 1, the wall member 58 is not just disposed within the decompressed internal space 10s but extends from the internal space 10s toward the outside of the chamber 10 to be in contact with the atmosphere at the outside of the chamber 10. Accordingly, the wall member 58 can be cooled sufficiently. Further, the wall member 58 is heated by the heater 62h. Therefore, the temperature of the wall member 58 is controllable.

In the exemplary embodiment, the spacer 59 may be provided between the chamber 10 and the wall member 58, as described above. The spacer 59 increases thermal resistance between the chamber 10 and the wall member 58. Accordingly, when the plasma is formed in the internal space 10s, the temperature rise of the chamber 10 can be suppressed even if the temperature of the wall member 58 is increased due to the heat from the plasma.

In the exemplary embodiment, the spacer 59 may be made of the material (for example, stainless steel) having the thermal conductivity lower than the thermal conductivity of the aluminum. This material of the spacer 59 has high thermal resistance. Thus, according to the present exemplary embodiment, the temperature rise of the chamber 10 can be further suppressed when the plasma is formed in the internal space 10s.

Figure 5:
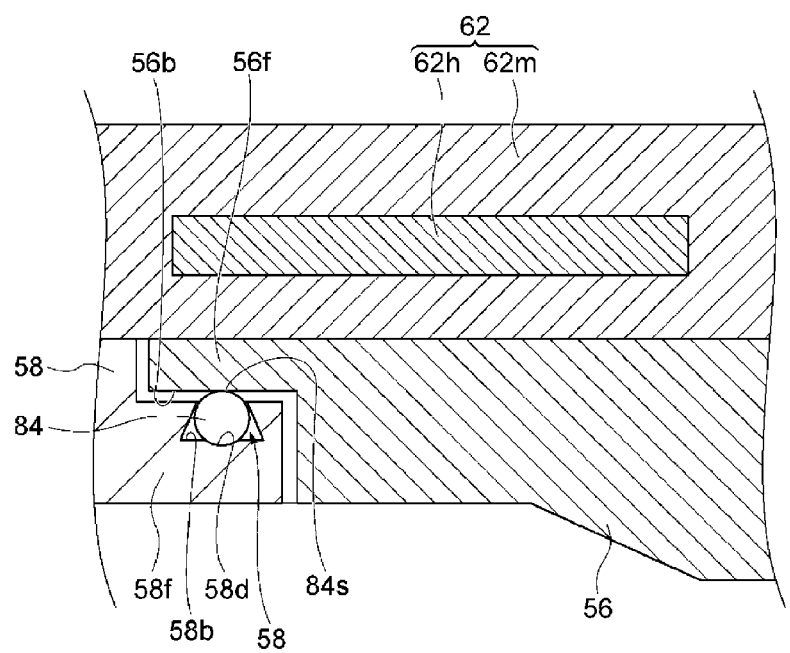
FIG. 5 is a partially enlarged cross sectional view of the plasma processing apparatus shown in FIG. 1.
Figure 6:
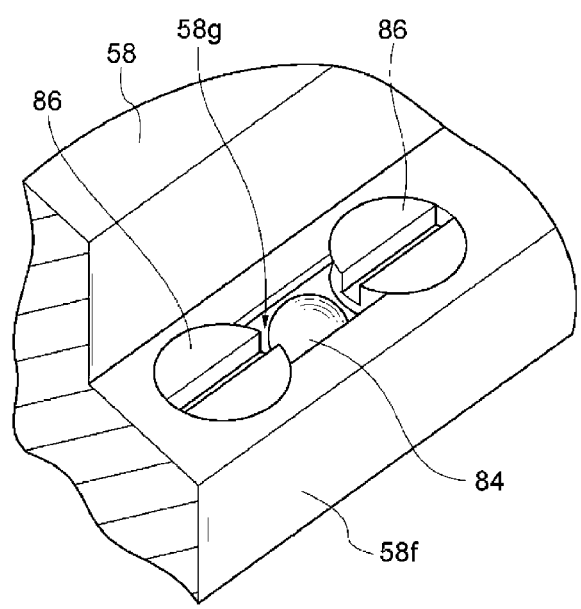
FIG. 6 is a partially enlarged perspective view of the plasma processing apparatus shown in FIG. 1.
Figure 7:
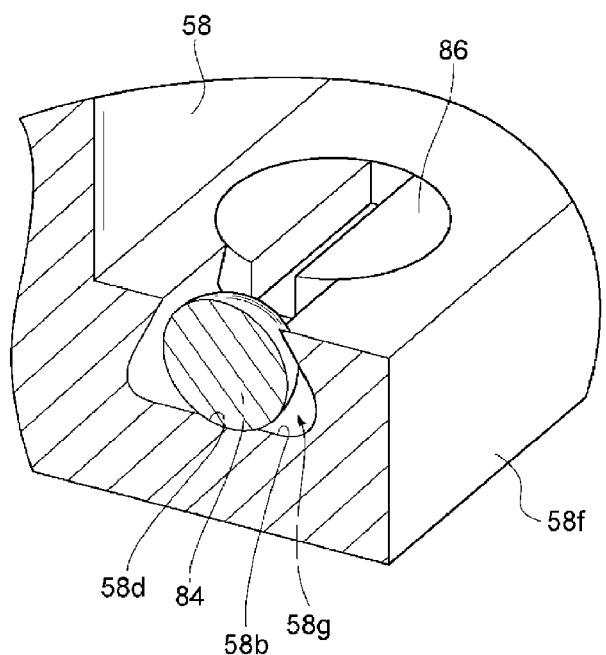
FIG. 7 is a partially enlarged perspective view of the plasma processing apparatus shown in FIG. 1.
Figure 8:
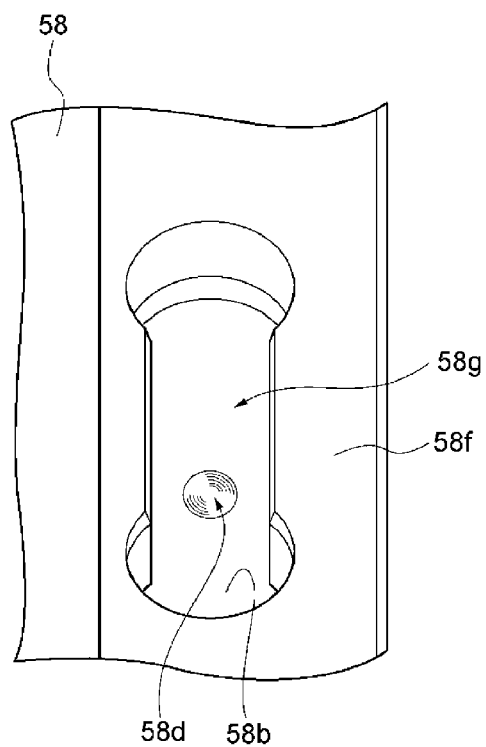
FIG. 8 is a partially enlarged perspective view of the plasma processing apparatus shown in FIG. 1.

Below, reference is made to FIG. 5 to FIG. 8 in addition to FIG. 1 to FIG. 4. FIG. 5 is a partially enlarged cross sectional view of the plasma processing apparatus shown in FIG. 1. FIG. 5 illustrates an insulating member according to the exemplary embodiment as well as the wall member 58 and the ground member 56. FIG. 6, FIG. 7 and FIG. 8 are partially enlarged perspective views of the plasma processing apparatus shown in FIG. 1. FIG. 6 and FIG. 7 illustrate the insulating member according to the exemplary embodiment as well as the wall member 58. FIG. 8 illustrates an example of a groove formed at the wall member 58.

The plasma processing apparatus 1 is further equipped with one or more insulating members 84. The one or more insulating members 84 are provided on the wall member 58. The ground member 56 is mounted on the one or more insulating members 84. The wall member 58 supports the ground member 56 in a non-contact state with the one or more insulating members 84 therebetween. Each of the one or more insulating members 84 has a spherical surface 84s. The ground member 56 is in contact with the spherical surface 84s of each of the one or more insulating members 84 to be mounted on the spherical surface 84s.

In the exemplary embodiment, the one or more insulating members 84 may have thermal conductivity lower than thermal conductivity of the ground member 56 and thermal conductivity of the wall member 58. By way of non-limiting example, the one or more insulating members 84 may be made of ceramics, quartz or stainless steel.

In the plasma processing apparatus 1, since the wall member 58 is exposed to the space at the outside of the chamber 10, the wall member 58 can be cooled. Accordingly, chemical species from the plasma is deposited on the surface of the wall member 58, so that the etching of the wall member 58 is suppressed. Further, since the ground member 56 is not in contact with the wall member 58, the heat exchange between the wall member 58 and the ground member 56 is suppressed, so that the cooling of the ground member 56 is suppressed. Thus, formation of a micro mask on the surface of the ground member 56 by the chemical species from the plasma is suppressed, so that etching of the ground member 56 in the state that the micro mask is formed is suppressed. Further, the ground member 56 is mounted on the spherical surface 84s of each of the one or more insulating members 84. Accordingly, the heat exchange between the one or more insulating members 84 and the ground member 56 is suppressed, so that the heat exchange between the wall member 58 and the ground member 56 is further suppressed. Moreover, local application of a large force to the ground member 56 is also suppressed. Therefore, a damage of the ground member 56 is suppressed.

In the exemplary embodiment, the plasma processing apparatus 1 may be equipped with a plurality of insulating members 84 as the one or more insulating members 84. Each of the plurality of insulating members 84 may be a spherical body. That is, the plasma processing apparatus 1 may be equipped with a plurality of spherical bodies as the plurality of insulating members 84. In the exemplary embodiment, the plurality of insulating members 84 may be arranged on the wall member 58 along the circumferential direction to support the ground member 56 which is mounted on the plurality of insulating members 84.

In the exemplary embodiment, an upper outer peripheral portion of the ground member 56 has a flange 56f. The flange 56f extends in the circumferential direction around the axis AX. The flange 56f may have a ring shape. The flange 56f has a bottom surface 56b. An inner peripheral portion of the wall member 58 has a flange 58f. The flange 58f extends in the circumferential direction around the axis AX. The flange 58f may have a ring shape. A top surface of the flange 58f extends under the bottom surface 56b of the flange 56f, facing the bottom surface 56b. The plurality of insulating members 84 are mounted on the flange 58f. The bottom surface 56b of the flange 56f of the ground member 56 is in contact with the spherical surface 84s of each of the plurality of insulating members 84.

In the exemplary embodiment, the wall member 58 may be provided with a plurality of grooves 58g opened upwards. In the exemplary embodiment, the flange 58f of the wall member 58 provides the plurality of grooves 58g. That is, the plurality of grooves 58g are formed at the flange 58f to be arranged in the circumferential direction. Each of the plurality of insulating members 84, that is, each of the plurality of spherical bodies is partially inserted in a corresponding groove among the plurality of grooves 58g. That is, each of the plurality of insulating members 84 is partially inserted in the corresponding groove 58g so that the spherical surface 84s thereof is protruded upwards from the flange 58f of the wall member 58.

In the exemplary embodiment, each of the plurality of grooves 58g may be in the form of a gourd. A width of an open end (that is, a top opening) of each groove 58g is smaller than a diameter of each insulating member 84 (that is, each spherical body). In the present exemplary embodiment, a center of each insulating member 84 is located within the corresponding groove 58g among the plurality of grooves 58g. In the exemplary embodiment, the insulating members 84 is suppressed from being escaped from the wall member 58.

In the exemplary embodiment, both ends of the open end of each of the plurality of grooves 58g in the circumferential direction are respectively closed by a pair of covers 86. Each of the plurality of insulating members 84 (that is, the plurality of spherical bodies) is disposed between the pair of covers 86 within the corresponding groove 58g. As an example, each of the pair of covers 86 is a screw. In this example, female screws are formed at the surface of the wall member 58 forming the both ends of the open end of each groove 58g in the circumferential direction.

In the exemplary embodiment, a bottom surface 58b forming a bottom of each groove 58g may be partially provided with a recess 58d. In the exemplary embodiment, each of the plurality of insulating members 84 (that is, the plurality of spherical bodies) may be partially put within the recess 58d in the corresponding groove 58g. According to this exemplary embodiment, movement of each insulating member 84 within the corresponding groove 58g is suppressed. Further, non-uniformity in positions of the plurality of insulating members 84 (that is, the plurality of spherical bodies) in a height direction, which might be caused by the presence of depressions of the wall member 58 due to the contact between the insulating members 84 and the wall member 58, is suppressed. In addition, non-uniformity in a contact pressure between the plurality of insulating members 84 and the ground member 56 is also suppressed.

In the exemplary embodiment, a region of the bottom surface 58b forming the recess 58d may be a spherical concave surface. In this configuration, each of the plurality of insulating members 84 is placed to partially extend along this region.

So far, the various exemplary embodiments have been described. However, the exemplary embodiments are not limiting, and various omissions, substitutions and changes may be made. Further, other exemplary embodiments may be embodied by combining elements in the various exemplary embodiments in a variety of other forms.

For example, although the plasma processing apparatus 1 is configured as a capacitively coupled plasma processing apparatus, the plasma processing apparatus may be of another type in other exemplary embodiments. Such a plasma processing apparatus of another type may be, by way of non-limiting example, an inductively coupled plasma processing apparatus, or a plasma processing apparatus configured to form plasma by using a surface wave such as a microwave.

According to the exemplary embodiment, it is possible to suppress the damage of the ground member which is made of the silicon and provided in the internal space of the chamber of the plasma processing apparatus.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An apparatus for plasma processing comprising:
a chamber;
a wall member, partially placed in an internal space of the chamber, extending from the internal space toward an outside of the chamber to be exposed to a space at the outside of the chamber;
one or more insulating members provided on the wall member; and
a ground member which is made of silicon, provided in the internal space such that the ground member is not exposed to the space at the outside of the chamber and mounted on the one or more insulating members, the ground member as well as the wall member being set to have a ground potential,
wherein the wall member is configured to support the ground member in a non-contact state with the one or more insulating members therebetween,
each of the one or more insulating members has a spherical surface, and
the ground member is in contact with the spherical surface and mounted on the spherical surface,
wherein the one or more insulating members are multiple spherical bodies,
wherein the wall member is provided with multiple grooves opened upwards, and
each of the multiple spherical bodies is partially located in a corresponding groove among the multiple grooves,
wherein a respective bottom surface of each of the multiple grooves has a spherical concave surface and a flat surface surrounding the spherical concave surface, and
each of the multiple spherical bodies is partially inserted into the spherical concave surface in the corresponding groove.

2. The apparatus of claim 1,
wherein each of the multiple grooves is in a form of a gourd, and a width of an open end thereof is smaller than a diameter of each of the multiple spherical bodies, and
a center of each of the multiple spherical bodies is located within the corresponding groove among the multiple grooves.

3. The apparatus of claim 1,
wherein each of the one or more insulating members has thermal conductivity lower than thermal conductivity of the ground member and thermal conductivity of the wall member.

4. The apparatus of claim 3,
wherein each of the one or more insulating members is made of ceramics, quartz or stainless steel.

* * * * *